(12) United States Patent
Huang

(10) Patent No.: US 12,317,477 B2
(45) Date of Patent: May 27, 2025

(54) MEMORY DEVICE, MEMORY CIRCUIT AND MANUFACTURING METHOD OF MEMORY CIRCUIT

(71) Applicant: AUO Corporation, Hsinchu (TW)

(72) Inventor: Chen-Shuo Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 448 days.

(21) Appl. No.: 17/988,764

(22) Filed: Nov. 17, 2022

(65) Prior Publication Data

US 2023/0189499 A1    Jun. 15, 2023

Related U.S. Application Data

(60) Provisional application No. 63/287,695, filed on Dec. 9, 2021.

(30) Foreign Application Priority Data

Jul. 14, 2022   (TW) .................................. 111126381

(51) Int. Cl.
    *H10B 12/00*        (2023.01)
(52) U.S. Cl.
    CPC ............. *H10B 12/20* (2023.02); *H10B 12/50* (2023.02)
(58) Field of Classification Search
    CPC ....... H10B 12/20; H10B 12/50; H01L 27/108; H01L 27/10802

USPC ............................................................ 257/43
See application file for complete search history.

(56) References Cited

U.S. PATENT DOCUMENTS

| 11,227,875 | B2   | 1/2022 | Kim et al. |
| 12,015,066 | B2 * | 6/2024 | Chang ................ H10D 84/0144 |
| 2021/0036028 | A1 | 2/2021 | Kim et al. |
| 2021/0273112 | A1 | 9/2021 | Yamazaki et al. |

FOREIGN PATENT DOCUMENTS

| CN | 206758441 | 12/2017 |
| CN | 112310151 | 2/2021 |

* cited by examiner

*Primary Examiner* — Monica D Harrison
(74) *Attorney, Agent, or Firm* — JCIPRNET

(57) ABSTRACT

A memory device includes a substrate, an oxide insulating layer, a first metal oxide layer, a first gate dielectric layer, a second metal oxide layer, a second gate dielectric layer, a first gate, a source, and a drain. The oxide insulating layer is located above the substrate. The first metal oxide layer is located above the oxide insulating layer. The first gate dielectric layer is located above the first metal oxide layer. The second metal oxide layer is located above the first gate dielectric layer. The second gate dielectric layer is located above the second metal oxide layer. The first gate is located above the second gate dielectric layer. The second metal oxide layer is located between the first gate and the first metal oxide layer. The source and the drain are electrically connected to the first metal oxide layer.

17 Claims, 9 Drawing Sheets

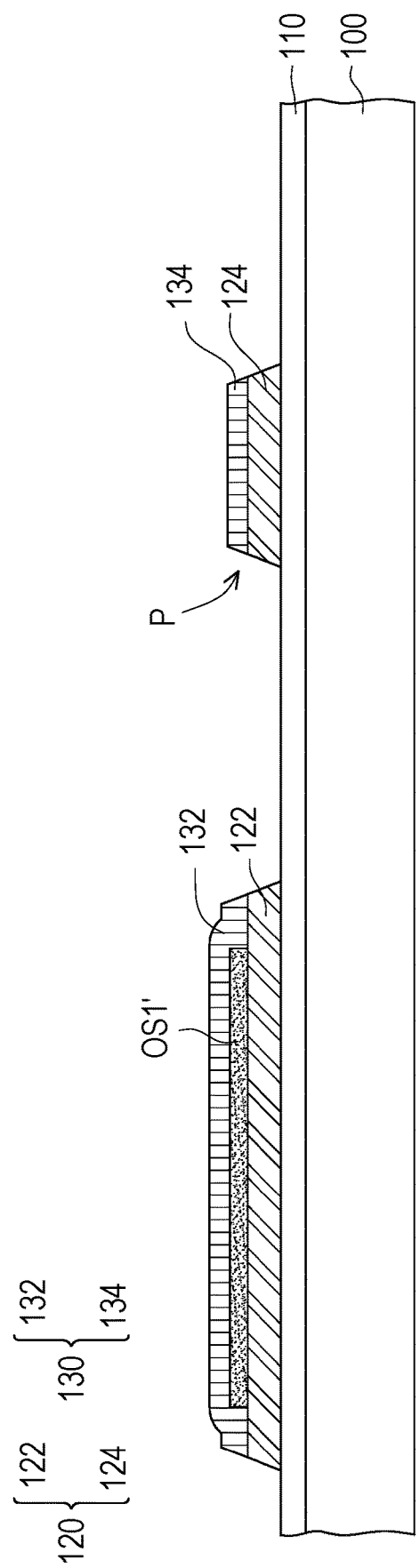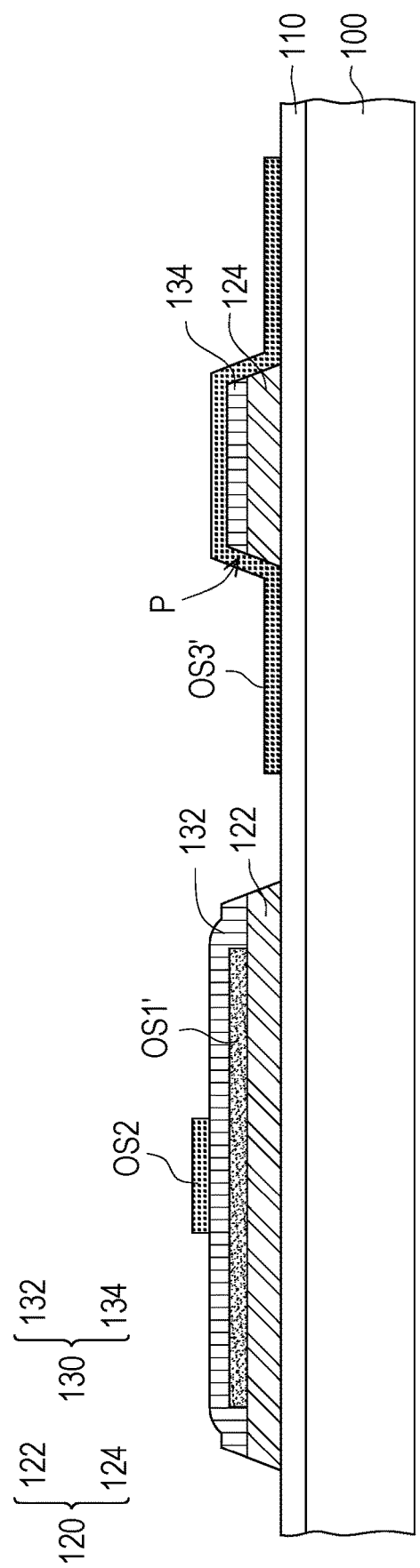

MEMORY DEVICE, MEMORY CIRCUIT AND MANUFACTURING METHOD OF MEMORY CIRCUIT

CROSS-REFERENCE TO RELATED APPLICATION

This application claims the priority benefit of U.S. provisional application Ser. No. 63/287,695, filed on Dec. 9, 2021, and Taiwan application serial no. 111126381, filed on Jul. 14, 2022. The entirety of each of the above-mentioned patent applications is hereby incorporated by reference herein and made a part of this specification.

BACKGROUND

Technical Field

The disclosure relates to a memory device, a memory circuit, and a manufacturing method of the memory device.

Description of Related Art

An electronically erasable programmable read-only memory (hereinafter referred to as EEPROM) is a memory device that can store data without power supply and exhibits the advantages of fast access speed, large capacity, and small size. Therefore, EEPROM has been widely used in various electronic products.

In a general EEPROM, by applying different control gate voltages (Vg) to the gate, it is controlled whether electrons tunnel into the floating gate. When the electrons enter the floating gate, the memory cell of the EEPROM will be stored with "1". Conversely, when the electrons escape from the floating gate, the memory cell of the EEPROM will be stored with "0".

SUMMARY

The disclosure provides a memory device, a memory circuit, and manufacturing method of the memory circuit, and the memory device exhibits the advantage of high access speed.

At least one embodiment of the disclosure provides a memory device. The memory device includes a substrate, an oxide insulating layer, a first metal oxide layer, a first gate dielectric layer, a second metal oxide layer, a second gate dielectric layer, a first gate, a source, and a drain. The oxide insulating layer is located above the substrate. The first metal oxide layer is located above the oxide insulating layer. The first gate dielectric layer is located above the first metal oxide layer. The second metal oxide layer is located above the first gate dielectric layer. The second gate dielectric layer is located above the second metal oxide layer. The first gate is located above the second gate dielectric layer. The second metal oxide layer is located between the first gate and the first metal oxide layer. The source and the drain are electrically connected to the first metal oxide layer.

At least one embodiment of the disclosure provides a memory circuit. The memory circuit includes a substrate, an oxide insulating layer, a first gate dielectric layer, a second gate dielectric layer, a memory device, and a thin film transistor. The oxide insulating layer is located above the substrate and includes a first oxygen-containing structure and a second oxygen-containing structure. The first gate dielectric layer is located above the oxide insulating layer and includes a first dielectric structure and a second dielectric structure. The second oxygen-containing structure and the second dielectric structure are stacked on each other to form a protruding structure. The second gate dielectric layer is located above the first gate dielectric layer. The memory device includes a first metal oxide layer, a second metal oxide layer, a first gate, a first source, and a first drain. The first metal oxide layer is located above the first oxygen-containing structure. The first dielectric structure is located between the first metal oxide layer and the second metal oxide layer. The second gate dielectric layer is located between the second metal oxide layer and the first gate. The second metal oxide layer is located between the first gate and the first metal oxide layer. The first source and the first drain are electrically connected to the first metal oxide layer. The thin film transistor includes a third metal oxide layer, a second gate, a second source, and a second drain. The third metal oxide layer covers a top surface and a side surface of the protruding structure. The second gate overlaps the third metal oxide layer. The second gate dielectric layer is located between the second gate and the third metal oxide layer. The second source and the second drain are electrically connected to the third metal oxide layer.

At least one embodiment of the disclosure provides a manufacturing method of a memory device, and the method includes the following steps. An oxide insulating layer is formed above a substrate. A first metal oxide layer is formed above the oxide insulating layer. A first gate dielectric layer is formed above the first metal oxide layer. A second metal oxide layer is formed above the first gate dielectric layer. A second gate dielectric layer is formed above the second metal oxide layer. A first gate is formed above the second gate dielectric layer. The second metal oxide layer is located between the first gate and the first metal oxide layer. A source and a drain electrically connected to the first metal oxide layer are formed.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3A to FIG. 3F are schematic cross-sectional views of a manufacturing method of the memory device of FIG. 1.

DESCRIPTION OF THE EMBODIMENTS

Figure 1:
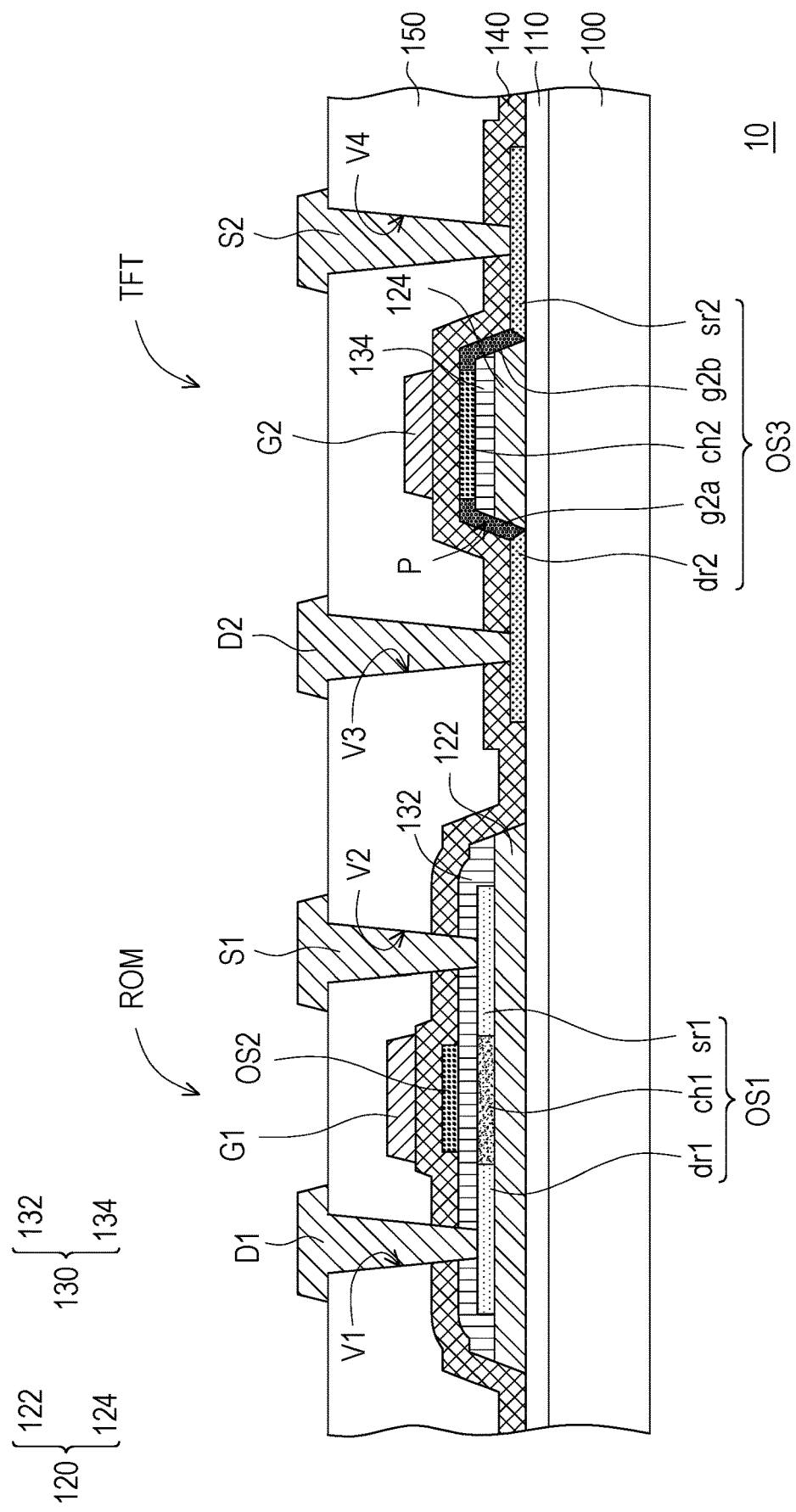
FIG. 1 is a schematic cross-sectional view of a memory circuit according to an embodiment of the disclosure.

FIG. 1 is a schematic cross-sectional view of a memory circuit according to an embodiment of the disclosure.

With reference to FIG. 1, a memory circuit 10 includes a substrate 100, an oxide insulating layer 120, a first gate dielectric layer 130, a second gate dielectric layer 140, a memory device ROM, and a thin film transistor TFT. In this embodiment, the memory circuit 10 further includes a buffer layer 110 and an interlayer dielectric layer 150.

A material of the substrate 100 may be glass, quartz, an organic polymer, an opaque/reflective material (e.g., a conductive material, metal, a wafer, ceramics, or other suitable materials), or other suitable materials. If a conductive material or metal is used, an insulating layer (not shown) is used to cover the substrate 100 to avoid the short circuit problem. In some embodiments, the substrate 100 is a flexible substrate, and the material of the substrate 100 is, for example, polyethylene terephthalate (PET), polyethylene naphthalate (PEN), polyester (PES), polymethylmethacrylate (PMMA), polycarbonate (PC), polyimide (PI), metal foil, or other flexible materials.

In some embodiments, the buffer layer 110 is located above the substrate 100, and the buffer layer 110 includes hydrogen. For instance, a material of the buffer layer 110 includes hydrogen-containing silicon nitride (or hydrogenated silicon nitride) or other suitable materials. In some embodiments, the buffer layer 110 blankets the substrate 100. In some embodiments, a thickness of the buffer layer 110 is 100 angstroms to 6,000 angstroms.

The oxide insulating layer 120 is located above the substrate 100. In this embodiment, the oxide insulating layer 120 is located on the buffer layer 110. In some embodiments, the oxide insulating layer 120 is patterned so as not to cover a portion of the buffer layer 110. In other words, the oxide insulating layer 120 covers a portion of the top surface of the buffer layer 110 and does not cover another portion of the top surface of the buffer layer 110. In some embodiments, the oxide insulating layer 120 includes a first oxygen-containing structure 122 and a second oxygen-containing structure 124. In some embodiments, the first oxygen-containing structure 122 and the second oxygen-containing structure 124 are separated from each other. In some embodiments, a material of the oxide insulating layer 120 includes silicon oxide, silicon oxynitride, aluminum oxide, hafnium oxide, or other suitable materials. In some embodiments, a thickness of the oxide insulating layer 120 is 300 angstroms to 5,000 angstroms.

The memory device ROM and the thin film transistor TFT are located above the substrate 100. In some embodiments, the memory device ROM and the thin film transistor TFT are located on the oxide insulating layer 120. The memory device ROM includes a first metal oxide layer OS1, a second metal oxide layer OS2, a first gate G1, a first source S1, and a first drain D1. The thin film transistor TFT includes a third metal oxide layer OS3, a second gate G2, a second source S2, and a second drain D2.

The first metal oxide layer OS1 is located above the first oxygen-containing structure 122 of the oxide insulating layer 120, and the first metal oxide layer OS1 contacts a top surface of the first oxygen-containing structure 122. The first oxygen-containing structure 122 is located between the first metal oxide layer OS1 and the buffer layer 110. The buffer layer 110 and the first oxygen-containing structure 122 are located between the first metal oxide layer OS1 and the substrate 100.

The first metal oxide layer OS1 includes a first source region sr1, a first drain region dr1, and a first channel region ch1 located between the first source region sr1 and the first drain region dr1. A resistivity of the first source region sr1 and a resistivity of the first drain region dr1 are lower than a resistivity of the first channel region ch1. In some embodiments, a distance between the first channel region ch1 and the substrate 100 is substantially equal to a distance between the first source region sr1 and the substrate 100 and the distance between the first drain region dr1 and the substrate 100.

In some embodiments, the first oxygen-containing structure 122 under the first metal oxide layer OS1 can supplement oxygen to the first metal oxide layer OS1, so that the resistivity of the first metal oxide layer OS1 is increased. In this embodiment, the first source region sr1, the first drain region dr, and the first oxygen-containing structure 122 under the first channel region ch1 have substantially uniform thicknesses.

The first gate dielectric layer 130 is located above the oxide insulating layer 120 and includes a first dielectric structure 132 and a second dielectric structure 134. The first dielectric structure 132 of the first gate dielectric layer 130 is located on the first metal oxide layer OS1 and covers the first metal oxide layer OS1. In some embodiments, the first source region sr1, the first drain region dr1, and the first channel region ch1 are all located between the first oxygen-containing structure 122 of the oxide insulating layer 120 and the first dielectric structure 132 of the first gate dielectric layer 130.

The second dielectric structure 134 is located above the second oxygen-containing structure 124, and the second oxygen-containing structure 124 is located between the second dielectric structure 134 and the buffer layer 110. The second oxygen-containing structure 124 and the second dielectric structure 134 are stacked on each other to form a protruding structure P. In some embodiments, a material of the first gate dielectric layer 130 includes silicon oxide, silicon oxynitride, aluminum oxide, hafnium oxide, or other suitable materials. In some embodiments, a thickness of the first gate dielectric layer 130 is 100 angstroms to 1,000 angstroms.

The second metal oxide layer OS2 is located above the first dielectric structure 132 of the first gate dielectric layer 130 and overlaps the first channel region ch1 of the first metal oxide layer OS1. The first dielectric structure 132 is located between the first metal oxide layer OS1 and the second metal oxide layer OS2.

The third metal oxide layer OS3 is located on the protruding structure P, covers the top surface and the side surface of the protruding structure P, and extends to the top surface of the buffer layer 110. The third metal oxide layer OS3 contacts the top surface of the second dielectric structure 134, the side surface of the second dielectric structure 134, the side surface of the second oxygen-containing structure 124, and the top surface of the buffer layer 110.

The third metal oxide layer OS3 includes a second drain region dr2, a second source region sr2, a second channel region ch2, a resistance gradient region g2a connected between the second drain region dr2 and the second channel region ch2, and a resistance gradient region g2b connected between the second source region sr2 and the second channel region ch2. The second channel region ch2 covers the top surface of the second dielectric structure 134, and the protruding structure P is located between the buffer layer 110 and the second channel region ch2. The resistance gradient region g2a and the resistance gradient region g2b contact the side surfaces of the protruding structure P (including the side surface of the second dielectric structure 134 and the side surface of the second oxygen-containing structure 124). The second drain region dr2 and the second source region sr2 extend from the side surface of the protruding structure P in a direction away from the protruding structure P, and the second drain region dr2 and the second source region sr2 contact the top surface of the buffer layer 110. A distance between the second channel region ch2 and the substrate 100 is greater than a distance between the second drain region dr2 and the substrate 100 and a distance between the second source region sr2 and the substrate 100.

In some embodiments, the protruding structure P under the third metal oxide layer OS3 can supplement oxygen to the third metal oxide layer OS3, so that the resistivity of the third metal oxide layer OS3 is increased. In this way, the thin film transistor TFT is prevented from being short-circuited because the resistivity of the second channel region ch2 is excessively low. In addition, in some embodiments, the first dielectric structure 132 under the second metal oxide layer OS2 also supplements oxygen to the second metal oxide layer OS2, so that the resistivity of the second metal oxide layer OS2 is adjusted.

The overall thickness of the protruding structure P may affect its capability of supplementing oxygen to the third metal oxide layer OS3, so that the resistivity of the third metal oxide layer OS3 in different regions is affected. To be specific, below the second channel region ch2, the overall thickness of the protruding structure P is relatively large, so the resistivity of the second channel region ch2 is relatively large. Below the resistance gradient region g2a and the resistance gradient region g2b, the overall thickness of the protruding structure P gradually decreases, so the resistivity of the resistance gradient region g2a and resistivity the resistance gradient region g2b also gradually decrease. In other words, the resistivity of the resistance gradient region g2a and the resistivity of the resistance gradient region g2b decrease as distances from the second channel region ch2 increase. There is no protruding structure P under the second drain region dr2 and the second source region sr2, and the resistivity of the second drain region dr2 and the resistivity of the second source region sr2 are lower than those of the second channel region ch2, the resistance gradient region g2a, and the resistance gradient region g2b. In some embodiments, the oxygen concentration of the second channel region ch2 is greater than the oxygen concentration of the resistance gradient region g2a and the oxygen concentration of the resistance gradient region g2b. The oxygen concentration of the resistance gradient region g2a and the oxygen concentration of the resistance gradient region g2b are greater than the oxygen concentration of the second drain region dr2 and the oxygen concentration of the second source region sr2.

In some embodiments, the materials of the first metal oxide layer OS1, the second metal oxide layer OS2, and the third metal oxide layer OS3 include metal compounds such as indium gallium tin zinc oxide (IGTZO) or indium gallium zinc oxide (IGZO), indium tin zinc oxide (ITZO), aluminum zinc tin oxide (AZTO), and indium tungsten zinc oxide (IWZO), or include oxides of any three of gallium (Ga), zinc (Zn), indium (In), tin (Sn), aluminum (Al), and tungsten (W), or lanthanide rare earth-doped metal oxides (e.g., Ln-IZO). In some embodiments, the first metal oxide layer OS1, the second metal oxide layer OS2, and the third metal oxide layer OS3 include the same material. In other embodiments, the material of the first metal oxide layer OS1 is different from the materials of the second metal oxide layer OS2 and the third metal oxide layer OS3. In some embodiments, the second metal oxide layer OS2 and the third metal oxide layer OS3 belong to the same patterned layer. In some embodiments, the carrier mobility of the second metal oxide layer OS2 and the carrier mobility of the second channel region ch2 of the third metal oxide layer OS3 are greater than the carrier mobility of the first channel region ch1 of the first metal oxide layer OS1, thereby increasing the switching speed of the thin film transistor TFT.

The second gate dielectric layer 140 is located above the buffer layer 110, the first dielectric structure 132 of the first gate dielectric layer 130, the second metal oxide layer OS2, and the third metal oxide layer OS3. The second metal oxide layer OS2 is located between the first dielectric structure 132 of the first gate dielectric layer 130 and the second gate dielectric layer 140. The third metal oxide layer OS3 is located between the second dielectric structure 134 of the first gate dielectric layer 130 and the second gate dielectric layer 140 and between the buffer layer 110 and the second gate dielectric layer 140. In some embodiments, a material of the second gate dielectric layer 140 includes silicon oxide, silicon oxynitride, aluminum oxide, hafnium oxide, or other suitable materials. In some embodiments, a thickness of the second gate dielectric layer 140 is 500 angstroms to 2,000 angstroms. In some embodiments, the thickness of the first gate dielectric layer 140 is less than the thickness of the second gate dielectric layer 130, thereby making it easier for electrons to tunnel from the first channel region ch1 to the second metal oxide layer OS2, and the switching speed of the memory device ROM is thus improved.

The first gate G1 and the second gate G2 are located on the second gate dielectric layer 140 and respectively overlap the first channel region ch1 of the first metal oxide layer OS1 and the second channel region ch2 of the third metal oxide layer OS3. The second gate dielectric layer 140 is located between the first gate G1 and the second metal oxide layer OS2 and between the second gate G2 and the third metal oxide layer OS3. The second metal oxide layer OS2 is located between the first gate G1 and the first channel region ch1 of the first metal oxide layer OS1.

In some embodiments, the materials of the first gate G1 and the second gate G2 may include metals, such as chromium (Cr), gold (Au), silver (Ag), copper (Cu), tin (Sn), lead (Pb), hafnium (Hf), tungsten (W), molybdenum (Mo), neodymium (Nd), titanium (Ti), tantalum (Ta), aluminum (Al), zinc (Zn), alloys of any combination of the foregoing metals, or stacks of the foregoing metals and/or alloys, but the disclosure is not limited thereto. The first gate G1 and the second gate G2 can also use other conductive materials, such as metal nitride, metal oxide, metal oxynitride, stacked layers of metal and other conductive materials, or other materials with conductive properties.

The interlayer dielectric layer 150 is located on the second gate dielectric layer 140 and covers the first gate G1 and the second gate G2. In some embodiments, a material of the interlayer dielectric layer 150 includes silicon oxide, silicon nitride, silicon oxynitride, hafnium oxide, aluminum oxide, or other insulating materials.

A first contact hole V1 and a second contact hole V2 pass through the interlayer dielectric layer 150, the second gate dielectric layer 140, and the first dielectric structure 132. The first drain D1 and the first source S1 are located on the interlayer dielectric layer 150 and are respectively filled in the first contact hole V1 and the second contact hole V2 to be electrically connected to the first metal oxide layer OS1. The first drain D1 and the first source S1 are respectively connected to the first drain region dr1 and the first source region sr1 of the first metal oxide layer OS1.

A third contact hole V3 and a fourth contact hole V4 pass through the interlayer dielectric layer 150 and the second gate dielectric layer 140. The second drain D2 and the second source S2 are located on the interlayer dielectric layer 150 and are respectively filled in the third contact hole V3 and the fourth contact hole V4 to be electrically connected to the third metal oxide layer OS3. The second drain D2 and the second source S2 are respectively connected to the second drain region dr2 and the second source region sr2 of the third metal oxide layer OS3.

The materials of the first drain D1, the first source S1, the second drain D2, and the second source S2 may include metals, such as chromium, gold, silver, copper, tin, lead, hafnium, tungsten, molybdenum, neodymium, titanium, tantalum, aluminum, zinc, alloys of any combination of the foregoing metals, or stacks of the foregoing metals and/or alloys, but the disclosure is not limited thereto. The first drain D1, the first source S1, the second drain D2, and the second source S2 can also use other conductive materials, such as metal nitride, metal oxide, metal oxynitride, stacked layers of metal and other conductive materials, or other materials with conductive properties.

Figure 2A:
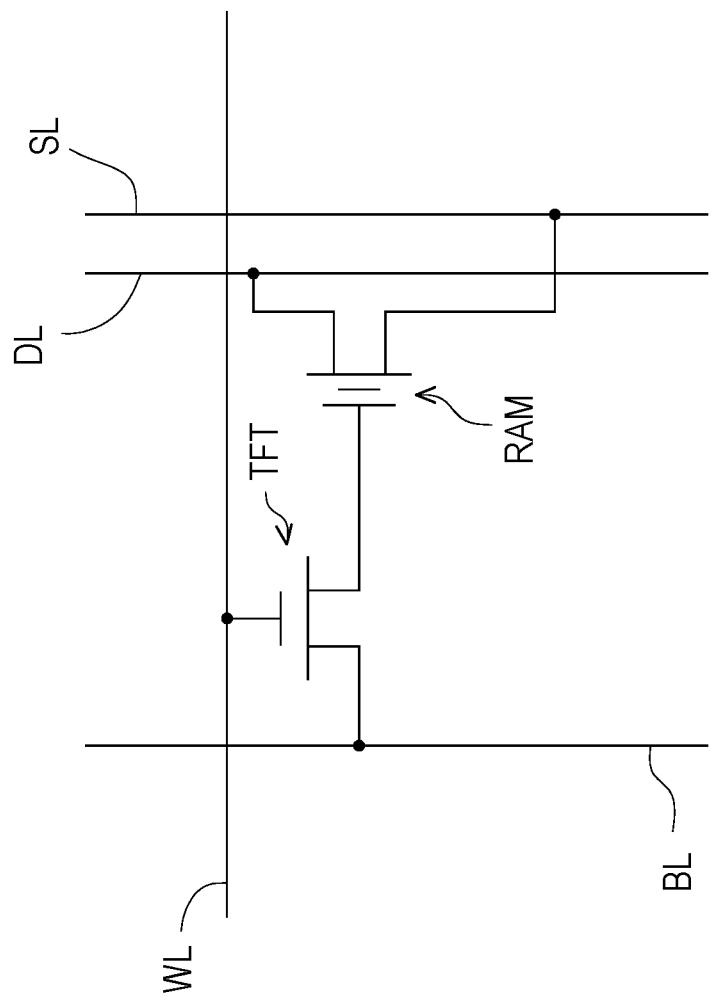
FIG. 2A is a circuit diagram of the memory circuit of FIG. 1.
Figure 2B:
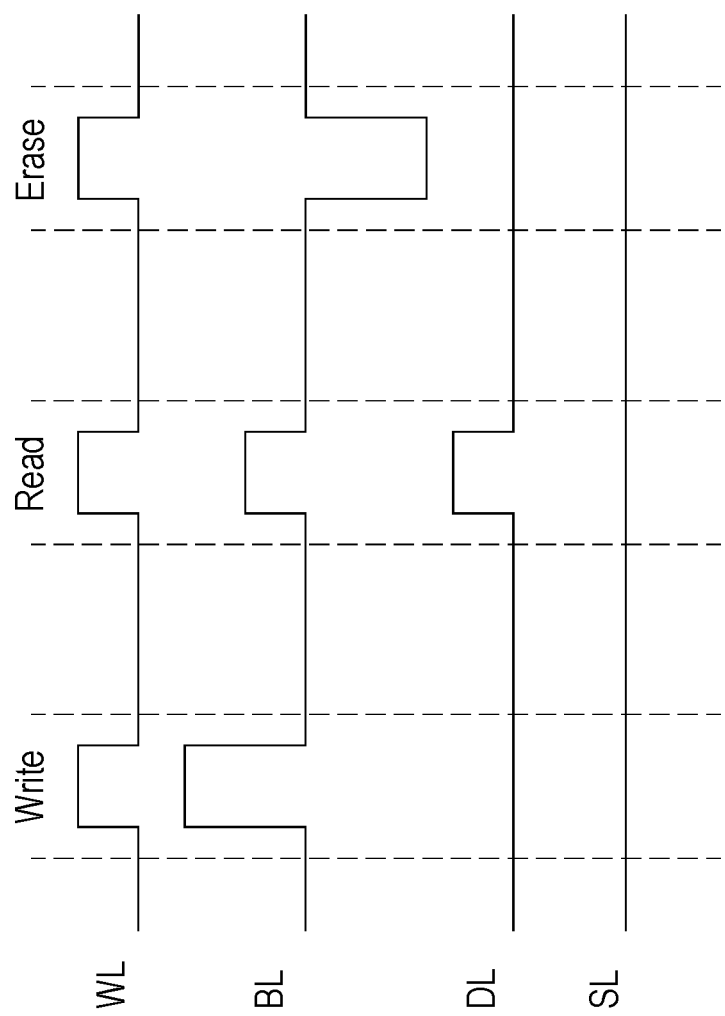
FIG. 2B is a signal diagram of the memory circuit of FIG. 2A.

FIG. 2A is a circuit diagram of the memory circuit of FIG. 1. FIG. 2B is a signal diagram of the memory circuit of FIG. 2A. In FIG. 2B, the vertical axis is voltage, and the horizontal axis is time.

With reference to FIG. 1 and FIG. 2A together, the memory circuit 10 further includes a word line WL, a bit line BL, a data line DL, and a source line SL. The word line WL is electrically connected to the second gate G2 of the thin film transistor TFT. The bit line BL is electrically connected to the second drain D2 of the thin film transistor TFT. The second source S2 of the thin film transistor TFT is electrically connected to the first gate G1 of the memory device ROM. The data line DL is electrically connected to the first drain D1 of the memory device ROM. The source line SL is electrically connected to the first source S1 of the memory device ROM.

With reference to FIG. 1, FIG. 2A, and FIG. 2B, when the write command of the memory device ROM is executed, a voltage is applied to the second gate G2 of the thin film transistor TFT through the word line WL to turn on the thin film transistor TFT, and at the same time, a first voltage (e.g., 15 V to 30 V) is applied to the second drain D2 of the thin film transistor TFT through the bit line BL. The signal on the bit line BL is transmitted to the first gate G1 of the memory device ROM, and the electric field causes electrons to tunnel from the first metal oxide layer OS1 through the first dielectric structure 132 of the first gate dielectric layer 130 into the second metal oxide layer OS2. Since electrons are stored in the second metal oxide layer OS2, the threshold voltage ($V_{th}$) of the memory device ROM is changed.

When the read command of the memory device ROM is executed, a voltage is applied to the second gate G2 of the thin film transistor TFT through the word line WL to turn on the thin film transistor TFT, and at the same time, a second voltage (e.g., 5 V to 15 V) is applied to the second drain D2 of the thin film transistor TFT through the bit line BL. The signal on the bit line BL is transmitted to the first gate G1 of the memory device ROM to turn on the memory device ROM, and at the same time, a voltage is applied to the first drain D1 of the memory device ROM through the data line DL, so that a voltage difference is generated between the first drain D1 and the first source S1 of the memory device ROM, so that the signal can pass through the memory device ROM. By reading the signal passing through the memory device ROM, it can be known that the memory device ROM is currently in state "1" or state "0". The second voltage used when executing the read command is lower than the first voltage used when executing the write command, so the threshold voltage of the memory device ROM is not easily changed due to electron tunneling when executing the write command.

When the erase command of the memory device ROM is executed, a voltage is applied to the second gate G2 of the thin film transistor TFT through the word line WL to turn on the thin film transistor TFT, and at the same time, a third voltage (e.g., −15 V to −30 V) is applied to the second drain D2 of the thin film transistor TFT through the bit line BL. The signal on the bit line BL is transmitted to the first gate G1 of the memory device ROM, and the electric field causes electrons to tunnel from the second metal oxide layer OS2 through the first dielectric structure 132 of the first gate dielectric layer 130 into the first metal oxide layer OS1, so that the threshold voltage of the memory device ROM may return to the original value.

Based on the above, the memory device ROM provides the advantage of high access speed.

FIG. 3A to FIG. 3F are schematic cross-sectional views of a manufacturing method of the memory device of FIG. 1.

Figure 3A:
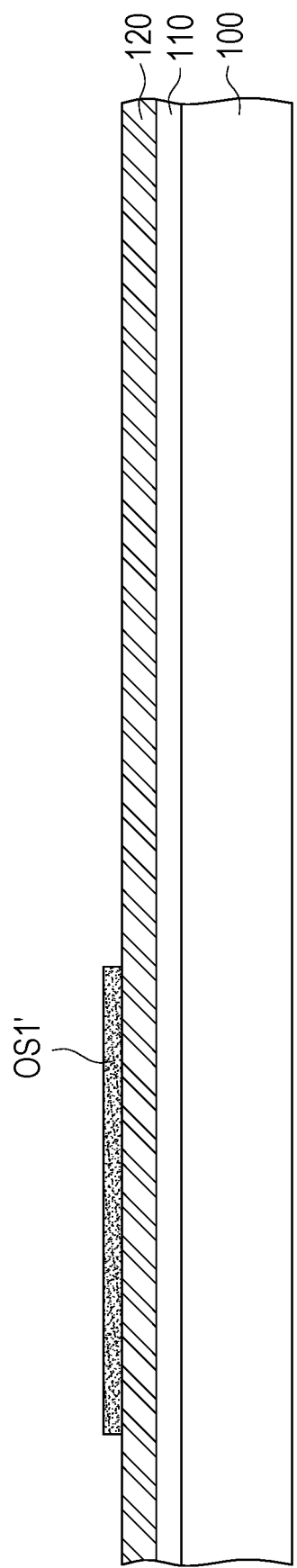

With reference to FIG. 3A, the buffer layer 110 and the oxide insulating layer 120 are formed on the substrate 100. In some embodiments, the buffer layer 110 blankets the substrate 100, and the oxide insulating layer 120 blankets the buffer layer 110.

A first metal oxide layer OS1' is formed above the oxide insulating layer 120. In some embodiments, the method of forming the first metal oxide layer OS1' includes the following steps. A first semiconductor material layer (not shown) is formed on the oxide insulating layer 120. A patterned photoresist (not shown) is formed on the first semiconductor material layer. The first semiconductor material layer is etched to form the first metal oxide layer OS1' by treating the patterned photoresist as a mask. As a final step, the patterned photoresist is removed.

Figure 3B:
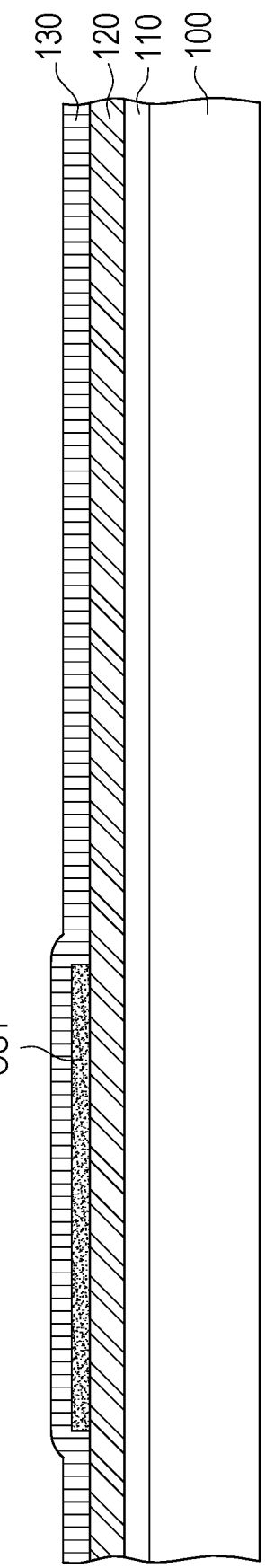

With reference to FIG. 3B, the first gate dielectric layer 130 is formed on the first metal oxide layer OS1' and the oxide insulating layer 120. In some embodiments, the first gate dielectric layer 130 blankets the first metal oxide layer OS1' and the oxide insulating layer 120.

With reference to FIG. 3C, a patterning process is performed on the oxide insulating layer 120 and the first gate dielectric layer 130, such that the oxide insulating layer 120 includes a first oxygen-containing structure 122 and a second oxygen-containing structure 124, and the first gate dielectric layer 130 includes a first dielectric structure 132 and a second dielectric structure 134. The first metal oxide layer OS1' is located between the first oxygen-containing structure 122 and the first dielectric structure 132. The second oxygen-containing structure 124 and the second dielectric structure 134 are stacked on each other to form a protruding structure P. In some embodiments, the patterning process includes wet etching or dry etching, and the patterning process etching stops at the buffer layer 110.

In some embodiments, the oxide insulating layer 120 and the first gate dielectric layer 130 are patterned by the same mask, so that the side surface of the first oxygen-containing structure 122 is aligned with the first dielectric structure 132, and the side surface of the second oxygen-containing structure 124 is aligned with the second dielectric structure 134.

Next, with reference to FIG. 3D, the second metal oxide layer OS2 and a third metal oxide layer OS3' are formed on the first gate dielectric layer 130. In this embodiment, the second metal oxide layer OS2 is formed on the first dielectric structure 132 of the first gate dielectric layer 130, and the third metal oxide layer OS3' is formed on the top surface of the protruding structure P, the side surface of the protruding structure P, and the buffer layer 110. In some embodiments, the method of forming the second metal oxide layer OS2 and the third metal oxide layer OS3' includes the following steps.

A second semiconductor material layer (not shown) is formed on the buffer layer 110, the oxide insulating layer 120, and the first gate dielectric layer 130. A patterned photoresist (not shown) is formed on the second semiconductor material layer. The second semiconductor material layer is etched to form the second metal oxide layer OS2 and the third metal oxide layer OS3' by treating the patterned photoresist as a mask. As a final step, the patterned photoresist is removed. In this embodiment, since the first metal oxide layer OS1' is covered by the first oxygen-containing structure 122 and the first dielectric structure 132, the foregoing etching process may not cause damage to the first metal oxide layer OS1'.

Figure 3E:
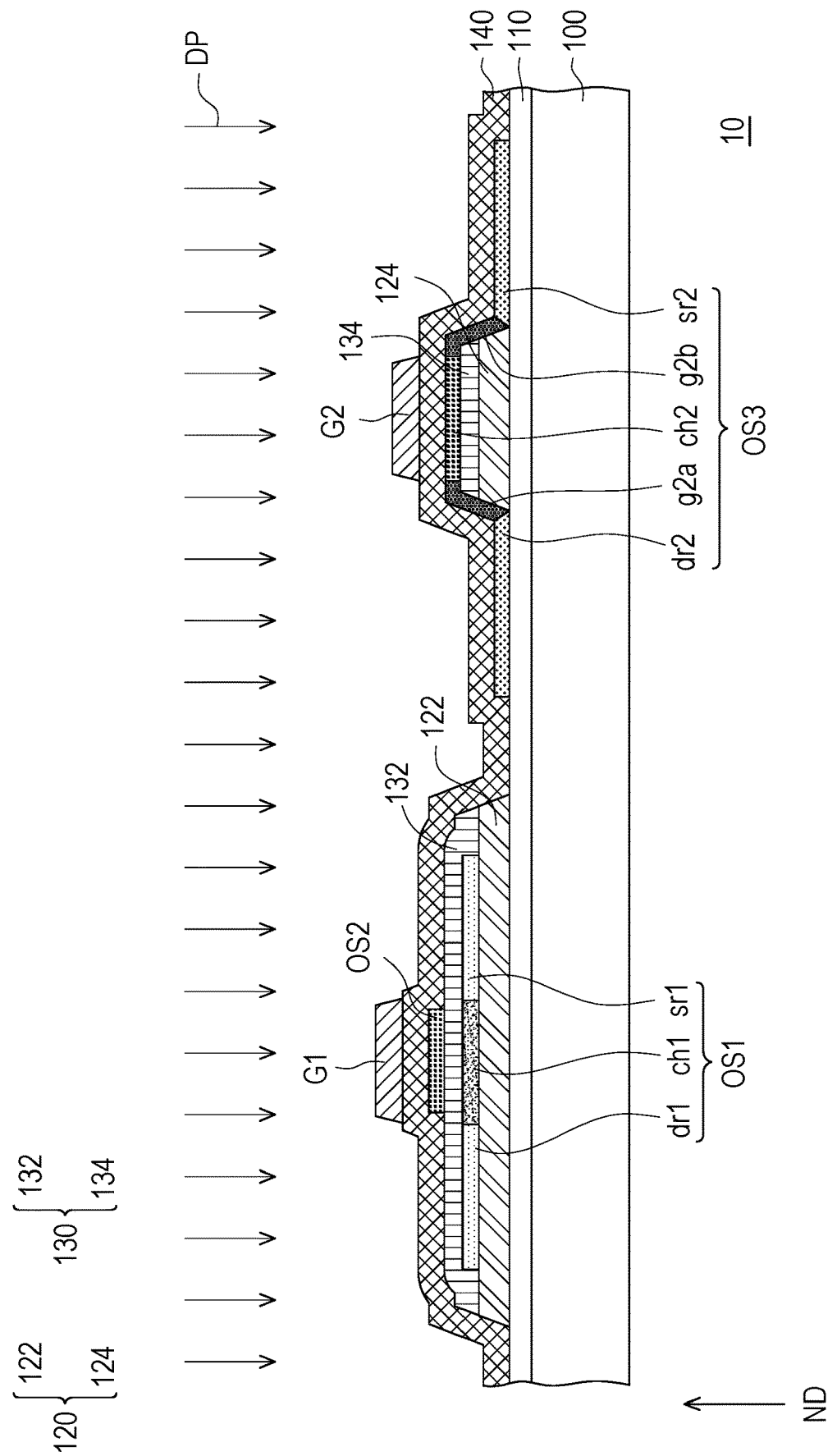

With reference to FIG. 3E, the second gate dielectric layer 140 is formed on the second metal oxide layer OS2 and the third metal oxide layer OS3'. In this embodiment, the second gate dielectric layer 140 is located on the second metal oxide layer OS2, the first dielectric structure 132, the buffer layer 110, and the third metal oxide layer OS3'.

The first gate G1 and the second gate G2 are formed above the second gate dielectric layer 140. The second metal oxide layer OS2 is located between the first gate G1 and the first metal oxide layer OS1', and the second gate G2 overlaps the third metal oxide layer OS3'.

In some embodiments, before the first gate G1 and the second gate G2 are formed, a heat treatment process is performed to diffuse oxygen in the protruding structure P into the third metal oxide layer OS3', thereby increasing the resistivity of the third metal oxide layer OS3' on the protruding structure P. In some embodiments, in the heat treatment process, oxygen in the first dielectric structure 132 is further diffused into the second metal oxide layer OS2, thereby increasing the resistivity of the second metal oxide layer OS2. In some embodiment, the heat treatment process is, for example, a heating process when the second gate dielectric layer 140 is deposited, but the disclosure is not limited thereto.

Next, a doping process DP is performed on the first metal oxide layer OS1' and the third metal oxide layer OS3' by treating the first gate G1 and the second gate G2 as masks. In this way, the first metal oxide layer OS1 including the first source region sr1, the first drain region dr1, and the first channel region ch1 and the third metal oxide layer OS3 including the second source region sr2, the second drain region dr2, the resistance gradient region g2a, the resistance gradient region g2b, and the second channel region ch2 are formed. In some embodiments, the doping process DP is, for example, a hydrogen plasma process or other suitable processes. In some embodiments, the first gate G1 completely shields the second metal oxide layer OS2 in a normal direction ND of the top surface of the substrate 100. Therefore, the first source region sr1 and the first drain region dr1 are not shielded by the second metal oxide layer OS2 during the doping process DP.

In some embodiments, the buffer layer 110 provides hydrogen to the third metal oxide layer OS3 during the process, thereby reducing the resistivity of the second source region sr2 and the resistivity of the second drain region dr2.

In this embodiment, the first gate G1 and the second gate G2 belong to the same patterned layer, and the first metal oxide layer OS1 and the second metal oxide layer OS2 may be doped through the same doping process DP. Therefore, the manufacturing costs of the memory device and the thin film transistor may be saved.

Figure 3F:
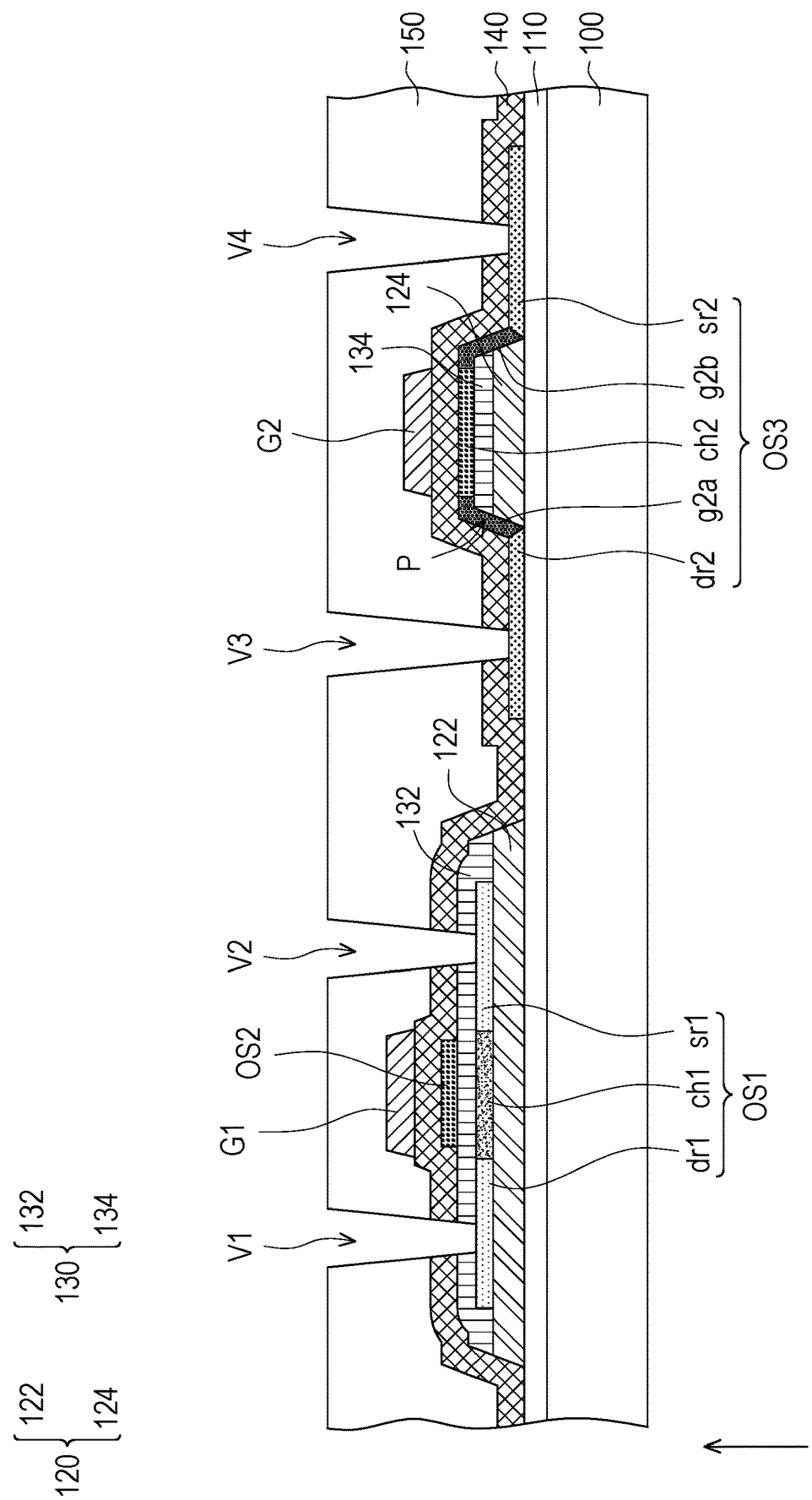

With reference to FIG. 3F, the interlayer dielectric layer 150 is formed on the second gate dielectric layer 140. Next, an etching process is performed to form the first contact hole V1, the second contact hole V2, the third contact hole V3, and the fourth contact hole V4.

Last but not least, with reference to FIG. 1 again, the first drain D1, the first source S1, the second drain D2, and the second source S2 are formed on the interlayer dielectric layer 150 and are respectively filled in the first contact hole V1, the second contact hole V2, the third contact hole V3, and the fourth contact hole V4. The memory circuit 10 is substantially completed so far. In some embodiments, the method of forming the first source S1, the first drain D1, the second source S2, and the second drain D2 includes the following steps. A conductive material layer (not shown) is formed on the interlayer dielectric layer 150. A patterned photoresist (not shown) is formed on the conductive material layer. The conductive material layer is etched to form the first source S1, the first drain D1, the second source S2, and the second drain D2 by treating the patterned photoresist as a mask. As a final step, the patterned photoresist is removed. In other words, the first source S1, the first drain D1, the second source S2, and the second drain D2 belong to the same patterned layer.

Figure 4:
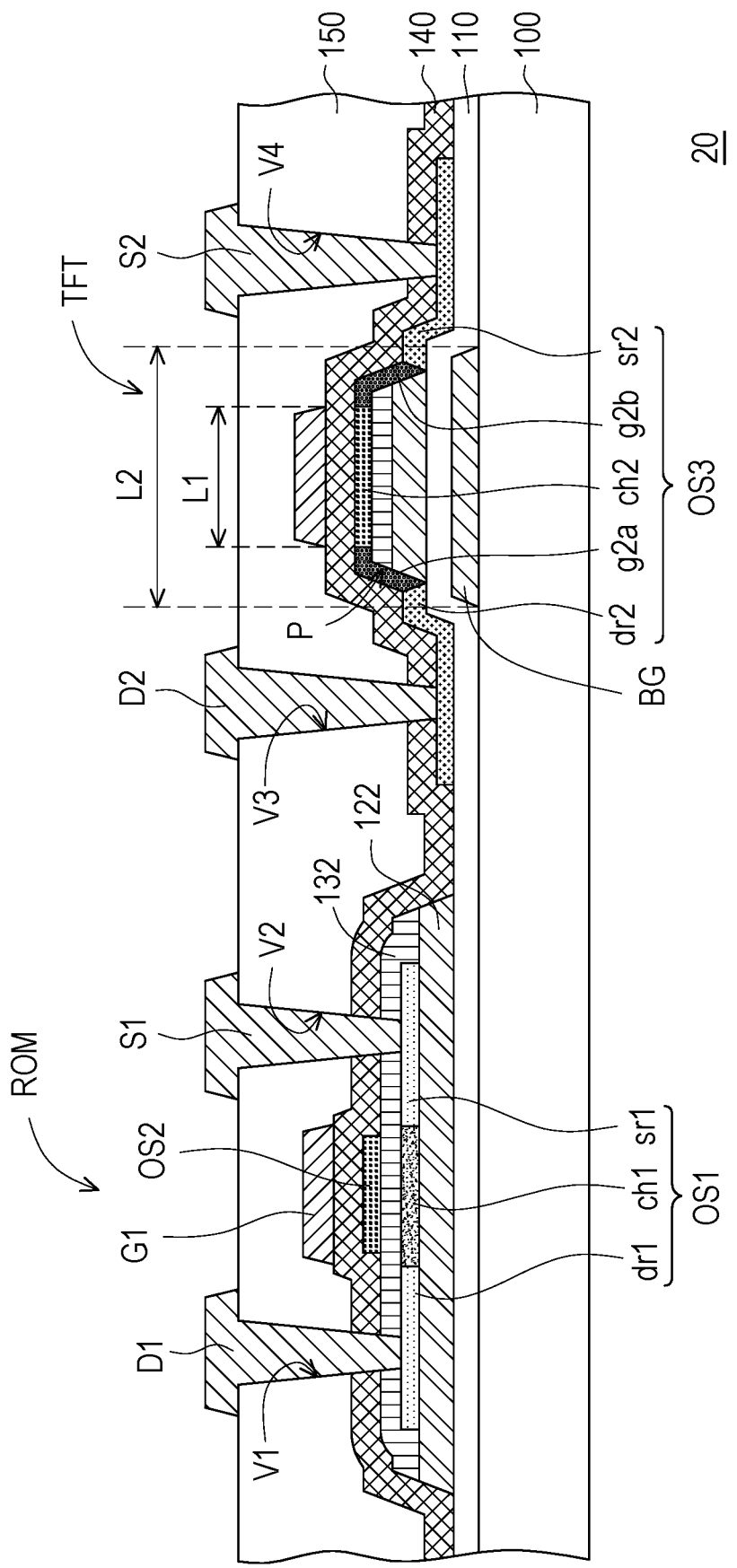
FIG. 4 is a schematic cross-sectional view of a memory circuit according to an embodiment of the disclosure.

FIG. 4 is a schematic cross-sectional view of a memory circuit according to an embodiment of the disclosure. It should be noted that the reference numerals and a part of the contents in the embodiment of FIG. 1 are also used to describe the embodiment of FIG. 4, in which the same reference numerals are used to represent identical or similar elements, and thus descriptions of the same technical contents are omitted. Please refer to the descriptions of the previous embodiments for the omitted part, which will not be repeated hereinafter.

The main differences between a memory circuit 20 of FIG. 4 and the memory circuit 10 of FIG. 1 is that the thin film transistor TFT of the memory circuit 20 further includes a bottom gate BG.

With reference to FIG. 1A, the bottom gate BG is located on the substrate 100. The buffer layer 110 is located on the bottom gate BG. The third metal oxide layer OS3 is located between the bottom gate BG and the second gate G2, and the protruding structure P is located between the bottom gate BG and the third metal oxide layer OS3. In some embodiments, a length L2 of the bottom gate BG is greater than a length L1 of the second gate G2.

Figure 5:
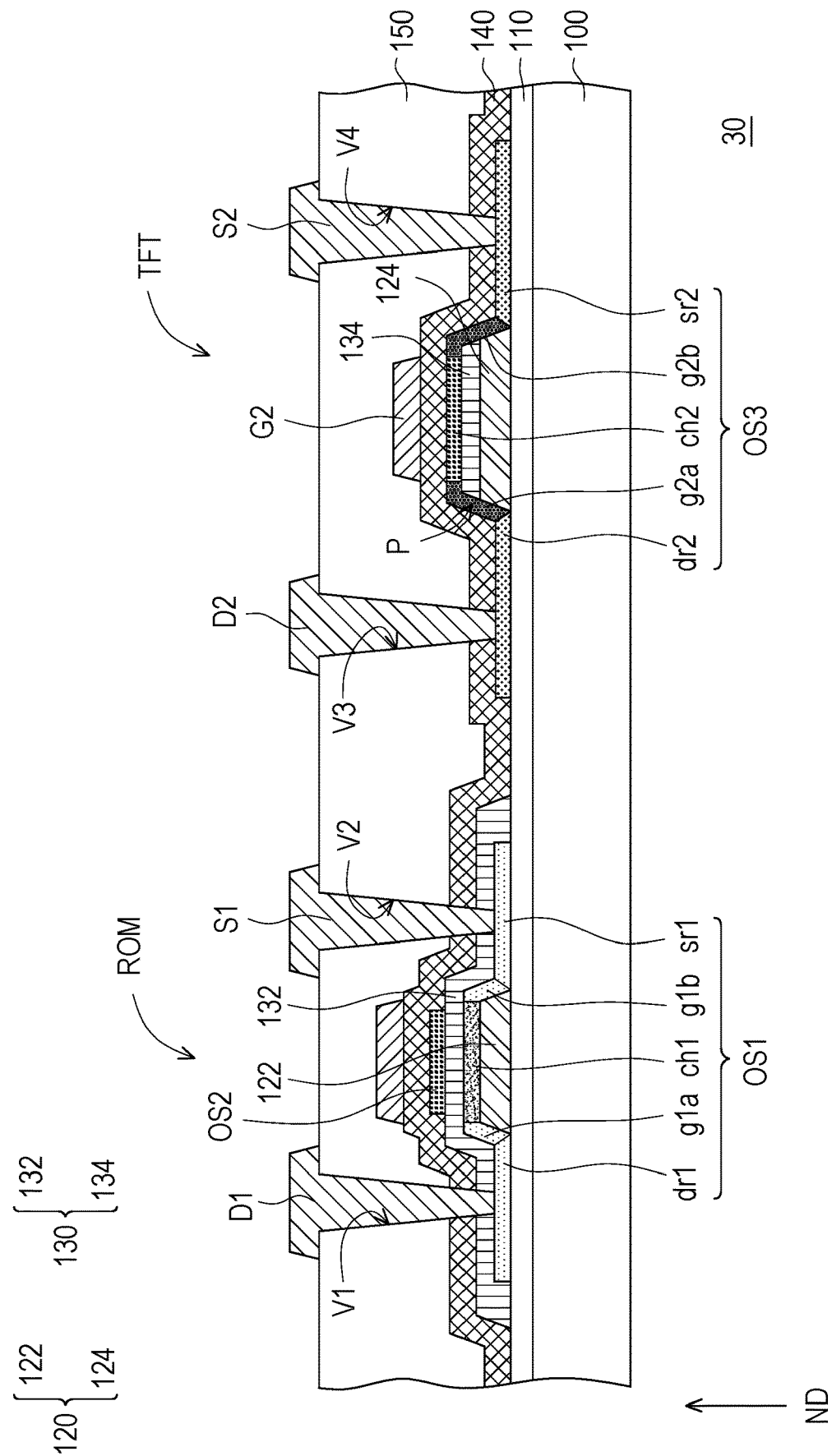
FIG. 5 is a schematic cross-sectional view of a memory circuit according to an embodiment of the disclosure.

FIG. 5 is a schematic cross-sectional view of a memory circuit according to an embodiment of the disclosure. It should be noted that the reference numerals and a part of the contents in the embodiment of FIG. 1 are also used to describe the embodiment of FIG. 5, in which the same reference numerals are used to represent identical or similar elements, and thus descriptions of the same technical contents are omitted. Please refer to the descriptions of the previous embodiments for the omitted part, which will not be repeated hereinafter.

The main differences between a memory circuit 30 of FIG. 5 and the memory circuit 10 of FIG. 1 is that the first metal oxide layer OS1 of the memory device ROM of the memory circuit 30 includes a resistance gradient region g1a and a resistance gradient region g1b. The resistance gradient region g1a is connected between the first drain region dr1 and the first channel region ch1, and the resistance gradient region g1b is connected between the first source region sr1 and the first channel region ch1.

With reference to FIG. 5, the first channel region ch1 of the first metal oxide layer OS1 is located on the first oxygen-containing structure 122, and the first oxygen-containing structure 122 is located between the first channel region ch1 and the buffer layer 110. The resistance gradient region g1a and the second resistance gradient region g1b of the first metal oxide layer OS1 contact the side surface of the first oxygen-containing structure 122. The first drain region dr1 and the first source region sr1 extend from the side surface of the first oxygen-containing structure 122 in a direction away from the first oxygen-containing structure 122, and the first drain region dr1 and the first source region sr1 contact the top surface of the buffer layer 110. A distance between the first channel region ch1 and the substrate 100 is greater than a distance between the first drain region dr1 and the substrate 100 and a distance between the first source region sr1 and the substrate 100.

In some embodiments, the first oxygen-containing structure 122 under the first metal oxide layer OS1 can supplement oxygen to the first metal oxide layer OS1, so that the resistivity of the first metal oxide layer OS1 is increased. In this way, the memory device ROM is prevented from being short-circuited because the resistivity of the first channel region ch1 is excessively low.

The thickness of the first oxygen-containing structure 122 may affect its capability of supplementing oxygen to the first metal oxide layer OS1, so that the resistivity of the first metal oxide layer OS1 in different regions is affected. To be specific, below the first channel region ch1, the overall thickness of the first oxygen-containing structure 122 is relatively large, so the resistivity of the first channel region ch1 is relatively large. Below the resistance gradient region g1a and the resistance gradient region g1b, the thickness of the first oxygen-containing structure 122 gradually decreases, so the resistivity of the resistance gradient region g1a and resistivity the resistance gradient region g1b also decrease gradually. In other words, the resistivity of the resistance gradient region g1 and the resistivity of the resistance gradient region g1b decrease as distances from the first channel region ch1 increase. There is no first oxygen-containing structure 122 under the first drain region dr1 and the first source region sr1, and the resistivity of the first drain region dr1 and the resistivity of the first source region sr1 are lower than those of the first channel region ch1, the resistance gradient region g1a, and the resistance gradient region g1b. In some embodiments, the oxygen concentration of the first channel region ch1 is greater than the oxygen concentration of the resistance gradient region g1a and the oxygen concentration of the resistance gradient region g1b. The oxygen concentration of the resistance gradient region g1a and the oxygen concentration of the resistance gradient region g1b are greater than the oxygen concentration of the first drain region dr1 and the oxygen concentration of the first source region sr1.

In some embodiments, the buffer layer 110 provides hydrogen to the first metal oxide layer OS1 during the process, thereby reducing the resistivity of the first source region sr1 and the resistivity of the first drain region dr1.

In view of the above, in the memory device ROM provided by the disclosure, the second metal oxide layer OS2 is located between the first gate G1 and the first metal oxide layer OS1. By applying a voltage to the first gate G1, electrons may tunnel between the first metal oxide layer OS1 and the second metal oxide layer OS2, so that the memory device ROM may be switched rapidly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a substrate;
an oxide insulating layer located above the substrate;
a first metal oxide layer located above the oxide insulating layer;
a first gate dielectric layer located above the first metal oxide layer;
a second metal oxide layer located above the first gate dielectric layer;
a second gate dielectric layer located above the second metal oxide layer;
a first gate located above the second gate dielectric layer, wherein the second metal oxide layer is located between the first gate and the first metal oxide layer; and
a source and a drain electrically connected to the first metal oxide layer.

2. The memory device according to claim 1, wherein the first metal oxide layer comprises a source region, a drain region, and a channel region located between the source region and the drain region, wherein a resistivity of the source region and a resistivity of the drain region are lower than a resistivity of the channel region, and the second metal oxide layer is located between the channel region and the first gate.

3. The memory device according to claim 2, further comprising:
a buffer layer located above the substrate, wherein the buffer layer contains hydrogen, wherein a first oxygen-containing structure of the oxide insulating layer is located between the channel region and the buffer layer, and the source region and the drain region contact the buffer layer.

4. The memory device according to claim 3, wherein the first metal oxide layer further comprises:
a first resistance gradient region and a second resistance gradient region contacting a side surface of the first oxygen-containing structure, wherein a resistivity of the first resistance gradient region and a resistivity of the second resistance gradient region decrease as distances from the channel region increase, wherein the first resistance gradient region is connected between the channel region and the source region, and the second resistance gradient region is connected between the channel region and the drain region.

5. The memory device according to claim 1, wherein a thickness of the first gate dielectric layer is less than a thickness of the second gate dielectric layer.

6. The memory device according to claim 1, wherein the first gate completely shields the second metal oxide layer in a normal direction of a top surface of the substrate.

7. A memory circuit, comprising:
a substrate;
an oxide insulating layer located above the substrate and comprising a first oxygen-containing structure and a second oxygen-containing structure;
a first gate dielectric layer located above the oxide insulating layer and comprising a first dielectric structure and a second dielectric structure, wherein the second oxygen-containing structure and the second dielectric structure are stacked on each other to form a protruding structure;
a second gate dielectric layer located above the first gate dielectric layer;

a memory device, comprising:
- a first metal oxide layer located above the first oxygen-containing structure;
- a second metal oxide layer, wherein the first dielectric structure is located between the first metal oxide layer and the second metal oxide layer;
- a first gate, wherein the second gate dielectric layer is located between second metal oxide layer and the first gate, and the second metal oxide layer is located between the first gate and the first metal oxide layer; and
- a first source and a first drain electrically connected to the first metal oxide layer; and a thin film transistor, comprising:
- a third metal oxide layer covering a top surface and a side surface of the protruding structure;
- a second gate overlapping the third metal oxide layer, wherein second gate dielectric layer is located between the second gate and the third metal oxide layer; and
- a second source and a second drain electrically connected to the third metal oxide layer.

8. The memory circuit according to claim 7, wherein the third metal oxide layer comprises:
- a channel region covering the top surface of the protruding structure;
- a first resistance gradient region and a second resistance gradient region contacting the side surface of the protruding structure, wherein a resistivity of the first resistance gradient region and a resistivity of the second resistance gradient region decrease as distances from the channel region increase; and
- a source region and a drain region extending from the side surface of the protruding structure in a direction away from the protruding structure, wherein the first resistance gradient region is connected between the channel region and the source region, and the second resistance gradient region is connected between the channel region and the drain region.

9. The memory circuit according to claim 8, further comprising:
- a buffer layer located above the substrate, wherein the buffer layer contains hydrogen, wherein the protruding structure is located between the channel region and the buffer layer, and the source region and the drain region contact the buffer region.

10. The memory circuit according to claim 7, further comprising:
- a word line electrically connected to the second gate;
- a bit line electrically connected to the second drain, wherein the second source is electrically connected to the first gate;
- a data line electrically connected to the first drain; and
- a source line electrically connected to the first source.

11. The memory circuit according to claim 7, wherein the thin film transistor further comprises:
- a bottom gate, wherein the third metal oxide layer is located between the bottom gate and the second gate, and the protruding structure is located between the bottom gate and the third metal oxide layer.

12. The memory circuit according to claim 11, wherein a length of the bottom gate is greater than a length of the second gate.

13. The memory circuit according to claim 7, wherein the second metal oxide layer and the third metal oxide layer belong to a same patterned layer.

14. A manufacturing method of a memory device, comprising:
- forming an oxide insulating layer above a substrate;
- forming a first metal oxide layer above the oxide insulating layer;
- forming a first gate dielectric layer above the first metal oxide layer;
- forming a second metal oxide layer above the first gate dielectric layer;
- forming a second gate dielectric layer above the second metal oxide layer;
- forming a first gate above the second gate dielectric layer, wherein the second metal oxide layer is located between the first gate and the first metal oxide layer; and
- forming a source and a drain electrically connected to the first metal oxide layer.

15. The manufacturing method of the memory device according to claim 14, further comprising:
- performing a patterning process on the oxide insulating layer and the first gate dielectric layer, such that the oxide insulating layer comprises a first oxygen-containing structure and a second oxygen-containing structure, and the first gate dielectric layer comprises a first dielectric structure and a second dielectric structure, wherein the second oxygen-containing structure and the second dielectric structure are stacked on each other to form a protruding structure;
- forming the second metal oxide layer on the first dielectric structure of the first gate dielectric layer and forming a third metal oxide layer on a top surface and a side surface of the protruding structure;
- forming the second gate dielectric layer on the second metal oxide layer and the third metal oxide layer;
- forming the first gate and the second gate on the second gate dielectric layer, wherein the second gate overlaps the third metal oxide layer; and
- forming a second source and a second drain electrically connected to the third metal oxide layer.

16. The manufacturing method of the memory device according to claim 15, further comprising:
- performing a doping process on the first metal oxide layer and the third metal oxide layer by treating the first gate and the second gate as masks.

17. The manufacturing method of the memory device according to claim 15, further comprising:
- performing a heat treatment process to diffuse oxygen in the protruding structure into the third metal oxide layer before forming the first gate and the second gate.

* * * * *